United States Patent
Choi et al.

(10) Patent No.: US 11,049,913 B2
(45) Date of Patent: Jun. 29, 2021

(54) DISPLAY DEVICE

(71) Applicant: SAMSUNG DISPLAY CO., LTD., Yongin-si (KR)

(72) Inventors: Jun Won Choi, Yongin-si (KR); Won Mi Hwang, Yongin-si (KR); Jun Young Min, Yongin-si (KR); Kwang Chul Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/421,795

(22) Filed: May 24, 2019

(65) Prior Publication Data

US 2020/0105840 A1     Apr. 2, 2020

(30) Foreign Application Priority Data

Oct. 1, 2018 (KR) .......................... 10-2018-0117098

(51) Int. Cl.

| | |
|---|---|
| *H01L 27/32* | (2006.01) |
| *H01L 51/52* | (2006.01) |
| *G06F 3/041* | (2006.01) |
| *G06F 3/044* | (2006.01) |
| *H01L 51/00* | (2006.01) |

(52) U.S. Cl.
CPC ............ *H01L 27/323* (2013.01); *G06F 3/044* (2013.01); *G06F 3/0412* (2013.01); *G06F 3/04164* (2019.05); *H01L 27/3276* (2013.01); *H01L 51/0097* (2013.01); *H01L 51/5253* (2013.01); *G06F 2203/04102* (2013.01)

(58) Field of Classification Search
CPC ...... G06F 3/044; G06F 3/0412; G06F 3/0416; H01L 27/3276; H01L 27/323; H01L 27/124; H01L 51/0097; H01L 51/5253
See application file for complete search history.

(56) References Cited

U.S. PATENT DOCUMENTS

| | | |
|---|---|---|
| 2016/0224156 A1 | 8/2016 | Ahn |
| 2017/0123557 A1 | 5/2017 | Na et al. |

(Continued)

FOREIGN PATENT DOCUMENTS

| | | |
|---|---|---|
| KR | 10-2016-0095594 | 8/2016 |
| KR | 10-2017-0052806 | 5/2017 |

(Continued)

OTHER PUBLICATIONS

Notice of Allowance dated May 11, 2020 in related U.S. Appl. No. 16/409,034.

*Primary Examiner* — Kent W Chang
(74) *Attorney, Agent, or Firm* — F. Chau & Associates, LLC

(57) ABSTRACT

A display device includes a substrate, a light emitting element located on the substrate, an encapsulation layer covering the light emitting element, a sensing electrode located on the encapsulation layer, a first sensing line including a first portion having a first thickness and a second portion having a second thickness, and a second sensing line extended from the sensing electrode. The second sensing line is in contact with the first portion of the first sensing line. The first thickness and the second thickness are substantially the same. The first portion is positioned higher than the second portion from the substrate.

21 Claims, 12 Drawing Sheets

(56) References Cited

U.S. PATENT DOCUMENTS

| | | |
|---|---|---|
| 2017/0262109 A1 | 9/2017 | Choi et al. |
| 2017/0364194 A1 | 12/2017 | Jang et al. |
| 2018/0040672 A1 | 2/2018 | Park et al. |
| 2018/0107316 A1* | 4/2018 | Hanari ................. G06F 3/0412 |
| 2018/0151662 A1 | 5/2018 | Rhe et al. |
| 2018/0158890 A1 | 6/2018 | Chang et al. |
| 2018/0373359 A1 | 12/2018 | Han et al. |
| 2020/0111843 A1 | 4/2020 | Han et al. |

FOREIGN PATENT DOCUMENTS

| | | |
|---|---|---|
| KR | 10-2017-0106621 | 9/2017 |
| KR | 10-1786119 | 10/2017 |
| KR | 10-2017-0142243 | 12/2017 |
| KR | 10-2018-0015326 | 2/2018 |
| KR | 10-2018-0059633 | 6/2018 |
| KR | 10-2018-0064600 | 6/2018 |
| WO | 2010/099132 | 9/2010 |

* cited by examiner

DISPLAY DEVICE

CROSS-REFERENCE TO RELATED APPLICATION

The present application claims priority under 35 U.S.C. § 119(a) to Korean patent application 10-2018-0117098 filed on Oct. 1, 2018 in the Korean Intellectual Property Office, the entire disclosure of which is incorporated by reference herein.

BACKGROUND

1. Technical Field

The present disclosure relates to a display device; more particularly, a display device having sensing lines directly connected to each other.

2. Related Art

With the development of information technologies, the importance of display devices which is a connection medium between a user and, information increases. Accordingly, display devices such as a liquid crystal display device, an organic light emitting display device, and plasma display devices are increasingly used.

When at least a portion of a display device is bent, the utilization of a space can be improved, or a narrow bezel can be more easily achieved.

However, stress acts in a bent area of the display device, and hence a simple configuration is required. Therefore, it is necessary to reliably align various types of lines in a non-display area between the bent area and a display area. In addition, the non-display area is minimized to achieve the above-described effect.

SUMMARY

According to an exemplary embodiment of the present inventive concept, a display device includes a substrate, a light emitting element located on the substrate, an encapsulation layer covering the light emitting element, a sensing electrode located on the encapsulation layer, a first sensing line including a first portion having a first thickness and a second portion having a second thickness, and a second sensing line extended from the sensing electrode. The second sensing line is in contact with the first portion of the first sensing line. The first thickness and the second thickness are substantially the same. The first portion is positioned higher than the second portion from the substrate.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
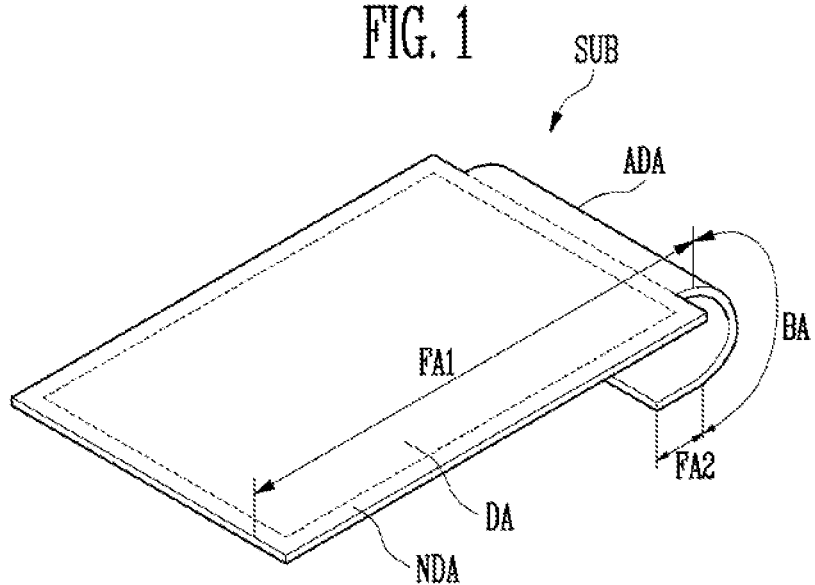
FIGS. 1 and 2 are views illustrating a display device according to an embodiment of the present disclosure.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

A part irrelevant to the description will be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

Figure 2:
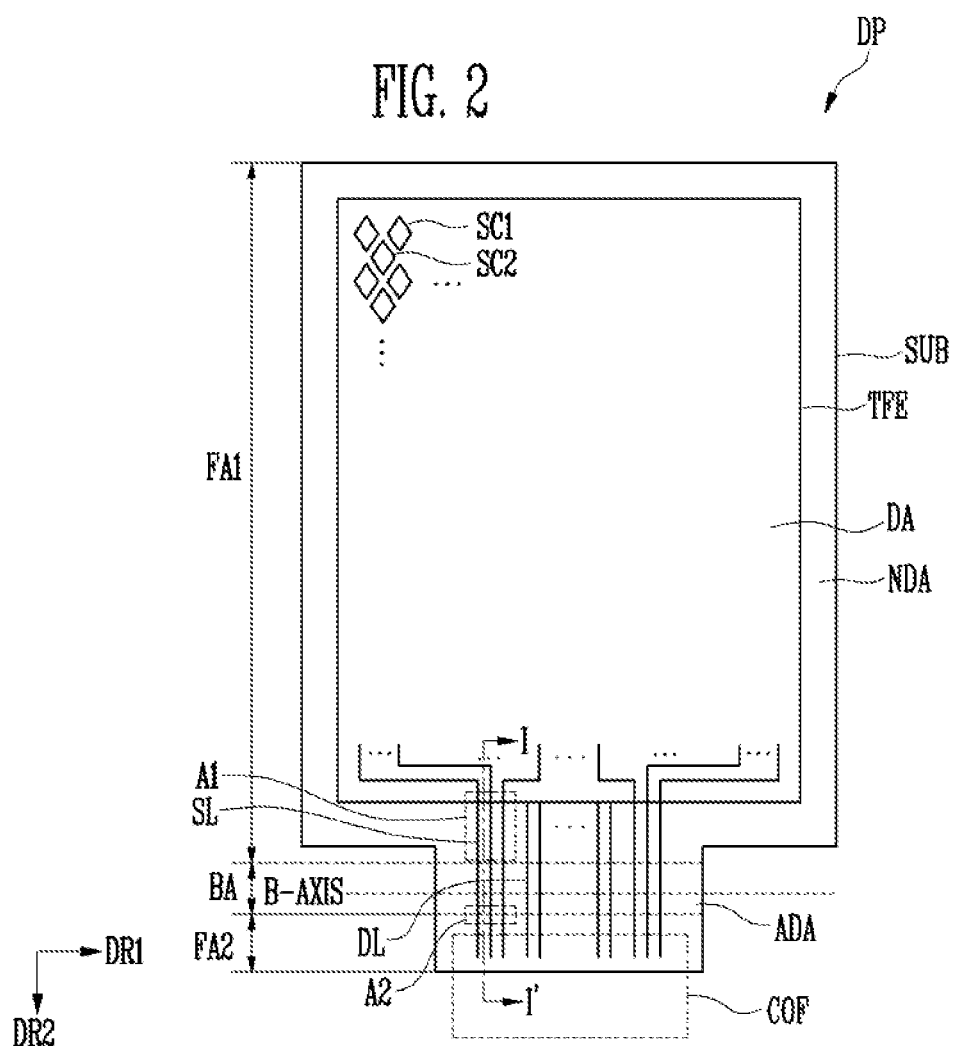

FIGS. 1 and 2 are views illustrating a display device according to an embodiment of the present disclosure.

Referring to FIGS. 1 and 2, the display device DP according to the embodiment of the present disclosure may include a substrate SUB, an encapsulation layer TFE, sensing electrodes SC1 and SC2, sensing lines SL, and display lines DL.

The substrate SUB may include a display area DA, a non-display area NDA, and an additional area ADA. The non-display area NDA may be a peripheral area surrounding the display area DA, and the additional area ADA may be an area extended away from one side of the non-display area NDA.

The substrate SUB may have an approximately rectangular shape. In some embodiments, the substrate SUB may include a pair of short sides parallel to each other in a first direction DR1 and a pair of long sides parallel to each other in a second direction DR2.

However, the shape of the substrate SUB is not limited thereto, and the substrate SUB may have various shapes. For example, the substrate SUB may be provided in various shapes such as a closed polygon including linear sides, a circle, an ellipse, etc., including curved sides, and a semi-circle, a semi-ellipse, etc., including linear and curved sides. In some embodiments, when the substrate SUB has linear sides, at least some of corners of each of the shapes may be formed in a curve. For example, when the substrate SUB has a rectangular shape, a portion at which adjacent linear sides meet each other may be replaced with a curve having a predetermined curvature. The curvature may be differently set depending on positions of the curvature. For example, the curvature may be changed depending on a position at which the curve is started, a length of the curve, etc.

The display area DA is an area in which pixels are provide such that an image is displayed. The pixels may include corresponding light emitting elements. Although the light emitting element of each of the pixels may be an organic light emitting element including an organic layer, but the present disclosure is not limited thereto, and the light emitting element may be implemented in various forms such as an inorganic light emitting element, a liquid crystal device, an electrophoretic device, and an electro-wetting device. Since the pixels and the light emitting elements are covered with the encapsulation layer TFE in FIG. 2, the pixels and the light emitting elements are not shown.

The non-display area NDA is an area in which the pixels are not provided, and the image is not displayed in the non-display area NDA. The display lines DL connected to the pixels and the sensing lines SL connected to the sensing electrodes SC1 and SC2 may extend on the non-display area NDA.

The display lines DL may include a scan line, a data line, a power voltage line, and the like, and provide signals such that the pixels, in response to the signals, display an image. These signals may be provided from a driving unit connected to the display lines DL.

The driving unit may include a scan driver for providing a scan signal to each pixel along the scan line, a data driver for providing a data voltage to each pixel along the data line, a timing controller for controlling the scan driver and the data driver, and the like. A circuit configuration of the driving unit will be described with reference to drawings from FIG. 9.

The scan driver may be mounted directly on the substrate SUB. When the scan driver is mounted directly on the substrate SUB, the scan driver may be formed together with the pixels in a process of forming the pixels. However, the position at which the scan driver is provided or the method of forming the scan driver is not limited thereto, and the scan driver may be provided on a separate chip or printed circuit board to be connected to a pad electrode on the substrate SUB.

The data driver may be mounted directly on the substrate SUB. However, the present disclosure is not limited thereto, and the data driver may be provided on a separate chip or printed circuit board to be connected to the pixels through a pad electrode on the substrate SUB. For example, the data driver may be provided in the form of chip-on-glass, chip-on-plastic, chip-on-film, etc. to be connected to the pad electrode of the substrate SUB. The timing controller may be provided separately from the data driver or be integrally provided with the data driver.

The additional area ADA may be protruded from sides constituting the non-display area NDA. Referring to FIG. 2, the additional area ADA may be protruded from a side corresponding to one of short sides of the non-display area NDA. In another embodiment, the additional area ADA may be protruded from one of long sides of the non-display area NDA or protruded from two or more of four sides of the non-display area NDA. In some embodiments, pad electrodes may be provided on the additional area ADA such that the driving unit is connected through the pad electrodes to the display device DP, or the driving unit may be directly connected to the display device DR However, the present disclosure is not limited thereto, and various components may be disposed.

The display area DA and the non-display area NDA may correspond to a first flat area FA1. That is, the display area DA and the non-display area NDA is not bent but may be flat.

A portion of the additional area ADA may correspond to the first flat area FA1, another portion of the additional area ADA may correspond to a bent area BA, still another portion of the additional area ADA may correspond to a second flat area FA2. That is, the additional area ADA may be bent in the bent area BA, and be flat in the first and second flat areas FA1 and FA2. Pad electrodes to be connected an external circuit may be positioned in the second flat area FA2, for example.

The bent area BA may be located between the first flat area FA1 and the second flat area FA2. In the bent area BA, when a line along which the display device DP is folded or bent is referred to as a bending axis B-AXIS, the bending axis B-AXIS may overlap with the bent area BA. The bending axis B-AXIS may extend in the first direction DR1 orthogonal to the second direction DR2 in which the additional area ADA protrudes from the non-display area NDA. The term "folded" or "bent" does not mean a fixed shape but means a shape deformable into another shape from the original shape, and includes a shape folded, curved, or rolled like a roll along one or more bending axes B-AXIS. The additional area ADA may be bent along the bending axis B-AXIS, As the additional area ADA is bent, various circuits such as driving integrated chips (IC) necessary to operate the display area DA may be positioned behind the display area DA and thus the width of a bezel may be decreased.

The encapsulation layer TFE may cover the whole of the display area DA, and cover a portion of the non-display area NDA. The encapsulation layer TFE covers the light emitting elements and circuit devices of the pixels of the display area DA, so that the display device DP may be prevented from being broken due to external moisture or impact.

The sensing electrodes SC1 and SC2 may be located on the encapsulation layer TFE. The sensing electrodes SC1 and SC2 may sense a touch input by a body part of a user, and provide a sensing signal to the sensing lines SL. The sensing electrodes SC1 and SC2 may be configured in different shapes according to various types such as a resistive type, a capacitive type, an electro-magnetic (EM) type, and an optical type. For example, when the sensing electrodes SC1 and SC2 are configured in the capacitive type, the sensing electrodes SC1 and SC2 may be in a self-capacitive type, a mutual-capacitive type, or the like.

When the sensing electrodes SC1 and SC2 are configured in the self-capacitive type, each of the sensing electrodes SC1 and SC2 may be independently driven, and differences between voltages according to capacitances formed by the respective sensing electrodes SC1 and SC2 and the body part of the user may be provided to corresponding sensing lines SL.

When the sensing electrodes SC1 and SC2 are configured in the mutual-capacitive type, a touch driving signal may be transmitted to a sensing line corresponding to a first sensing electrode SC1, and a sensing signal may be received by a sensing line corresponding to a second sensing electrode SC2 that forms a mutual capacitance with the first sensing electrode SC1. When the body part of the user approaches, the mutual capacitance between the first sensing electrode SC1 and the second sensing electrode SC2 may be changed, and it may be detected whether the user has touched the display device DP, according to a difference between sensing signals, which is caused by the change in mutual capacitance.

The sensing lines SL may connect the sensing electrodes SC1 and SC2 and the pad electrodes. Therefore, when an external touch driving circuit is connected to the pad electrodes on a chip on film (or a chip on flexible printed circuit) COF, the sensing electrodes SC1 and SC2 may perform a user touch sensing function. For example, the external touch driving circuit may be mounted on the chip on film COF to be connected to the pad electrodes. The pad electrodes may be provided to the second flat area FA2 of the additional area ADA. The sensing lines SL may be extended to overlap with the first flat area FA1, the bent area BA, and the second flat area FA2.

Figure 3:
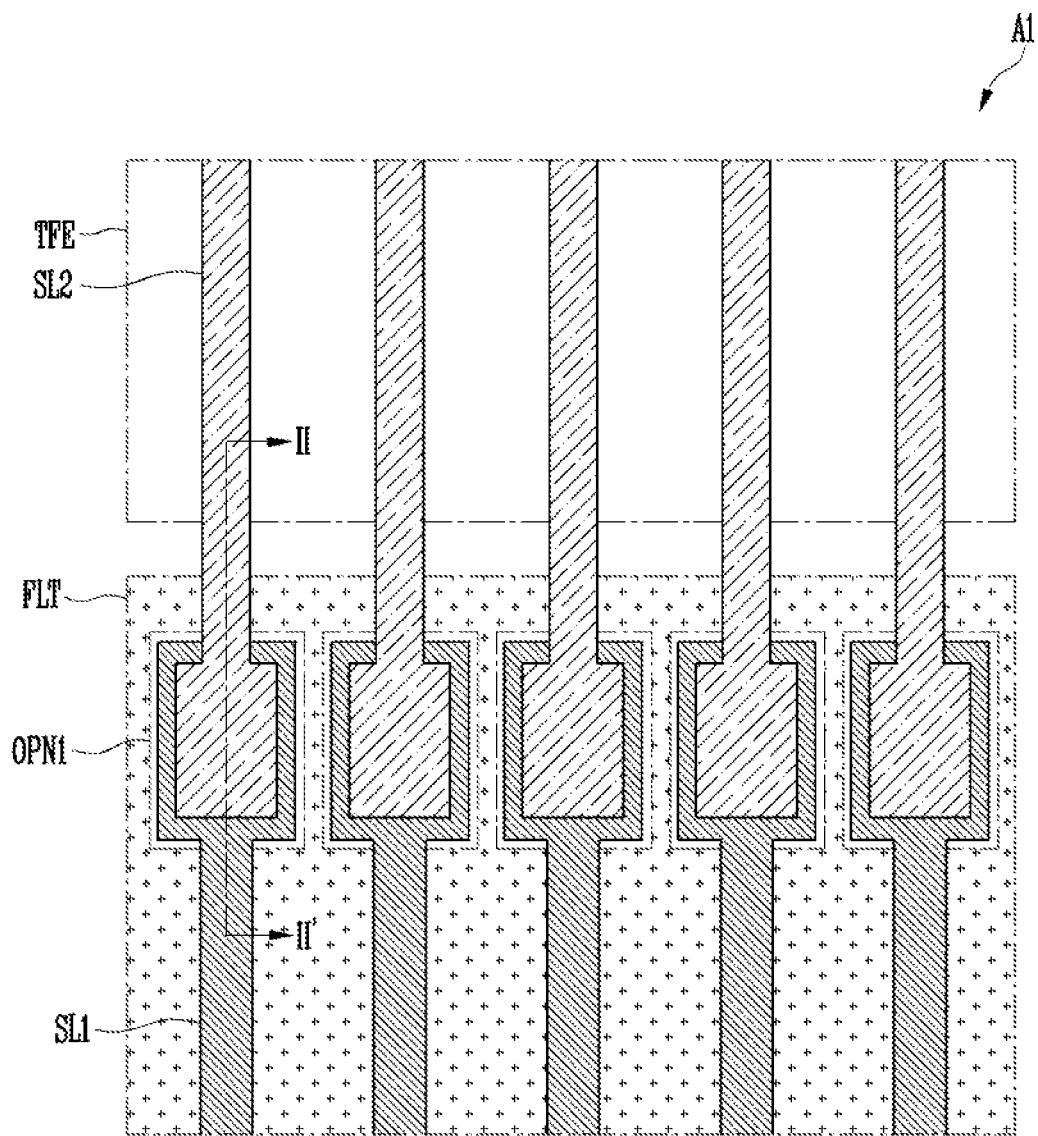
FIG. 3 is a view illustrating a first area according to a first embodiment of the present disclosure.
Figure 4:
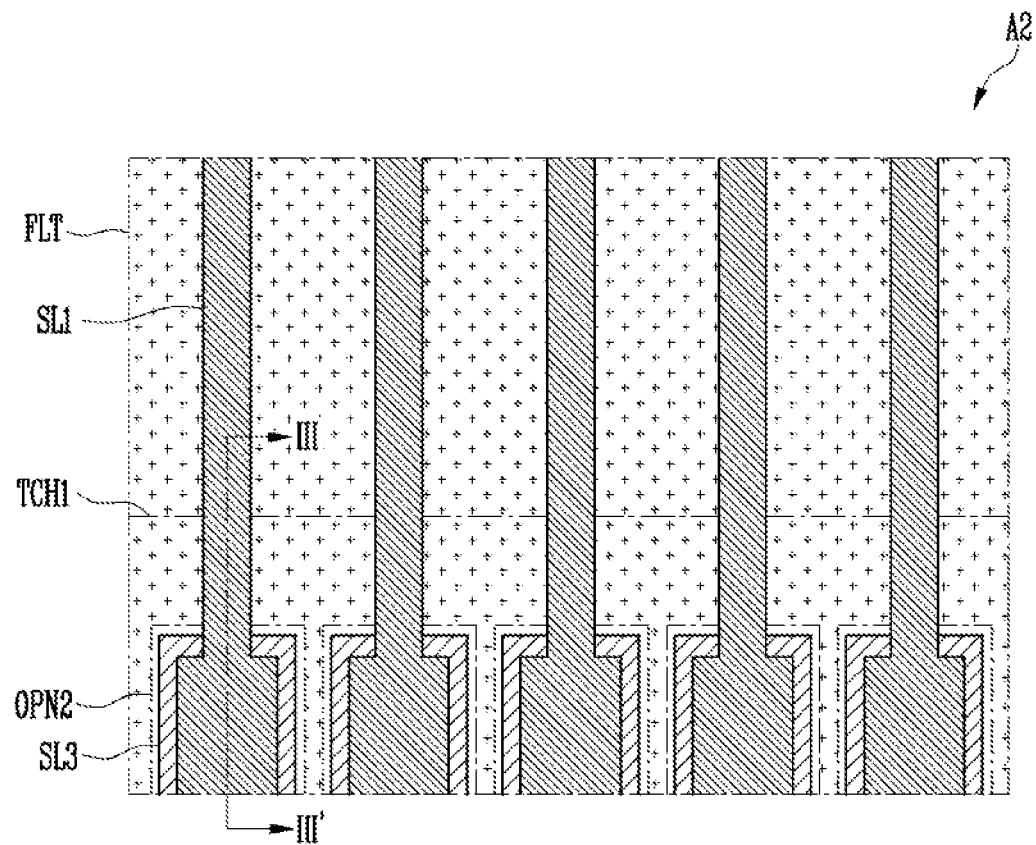
FIG. 4 is a view illustrating a second area according to the first embodiment of the present disclosure.
Figure 5:
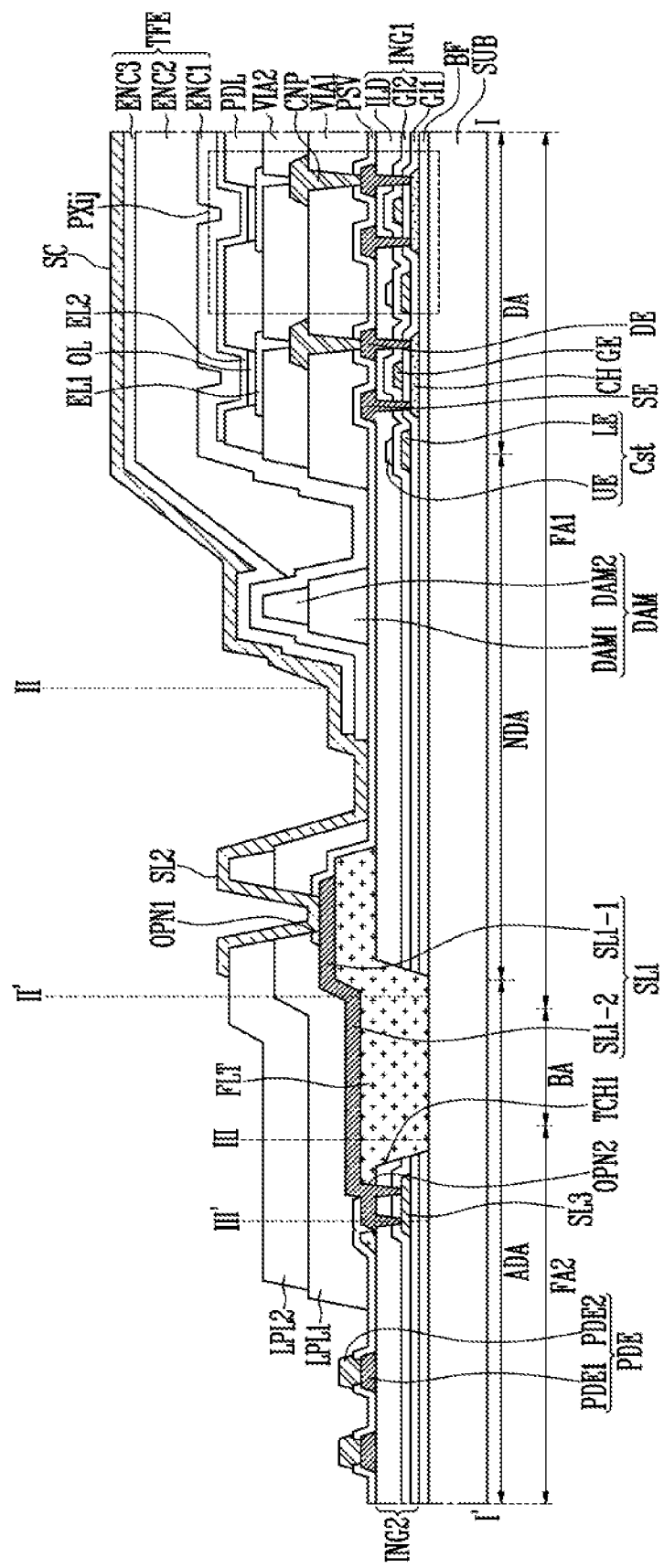
FIG. 5 is a sectional view taken along lines I-I', II-II', and III-III' according to the first embodiment of the present disclosure.

FIG. 3 is a view illustrating a first area according to a first embodiment of the present disclosure. FIG. 4 is a view illustrating a second area according to the first embodiment of the present disclosure. FIG. 5 is a sectional view taken along lines I-I', II-II', and III-III' according to the first embodiment of the present disclosure.

The first area A1 is an area in which a first sensing line SL1 is connected to a second sensing line SL2, and the second area A2 is an area in which the first sensing line SL1 is connected to a third sensing line SL3.

In FIGS. 3 and 4, a relative arrangement of a planarization layer FLT, the first to third sensing lines SL1, SL2, and SL3, and the encapsulation layer TFE is emphasized and illustrated, and illustration of the other components is omitted. A detailed stacking structure of each component will be described with reference to FIG. 5, For convenience of description, the display device DP in a state in which it is not bent will be described in FIG. 5.

First, the display area DA will be described.

In an embodiment of the present disclosure, pixels PXij are provided in the display area DA. Each pixel PXij may include a transistor connected to a corresponding line among the display lines DL, a light emitting element connected to the transistor, and a capacitor Cst. The transistor may correspond to a driving transistor for controlling the light emitting element, a switching transistor for switching the driving transistor, or the like, A circuit connection structure of the transistor will be described with reference to drawings from FIG. 9. In FIG. 5, for convenience of description, one transistor, one light emitting element, and one capacitor are exemplarily illustrated with respect to one pixel PXij.

The substrate SUB may be made of an insulating material such as glass or resin. The substrate SUB may be made of a material having flexibility to be bendable or foldable. The substrate SUB may have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and the substrate SUB may be made of a Fiber Reinforced Plastic (FRP), etc.

For example, when the substrate SUB has a multi-layered structure, inorganic materials such as silicon nitride, silicon oxide, and silicon oxynitride may be interposed in a single layer or plural layers between a plurality of layers.

A buffer layer BF may cover the substrate SUB. The buffer layer BF may prevent an impurity from being diffused into a channel CH of the transistor. The buffer layer BF may be an inorganic insulating layer made of an inorganic material. For example, the buffer layer BF may be formed of silicon nitride, silicon oxide, silicon oxynitride, etc., and be omitted according to the material and process conditions of the substrate SUB. In some embodiments, a barrier layer may be further provided.

An active layer may be located on the buffer layer BE The active layer may be doped and patterned to form a channel, a source region, and a drain region of the transistor or to form a line. The active layer may be a semiconductor pattern made of poly-silicon, amorphous silicon, oxide semiconductor, etc. The present inventive concept is not limited thereto. For example, the channel CH may be a semiconductor pattern undoped with an impurity, and may be an intrinsic semiconductor. The impurity may include impurities such as an n-type impurity, a p-type impurity, and other metals.

A first gate insulating layer GI1 may cover the channel CH and other active layers. The first gate insulating layer GI1 may be an inorganic insulating layer made of an inorganic material. The inorganic material may include inorganic insulating materials such as polysiloxane, silicon nitride, silicon oxide, and silicon oxynitride.

A gate electrode GE of the transistor and a capacitor lower electrode LE may be located on the first gate insulating layer GI1. The gate electrode GE may overlap a region corresponding to the channel CH.

The gate electrode GE and the capacitor lower electrode LE may be made of a metal. For example, the gate electrode GE may be made of at least one of metals such as gold (Au), silver (Ag), aluminum (Al), molybdenum (Mo), chromium (Cr), titanium (Ti), nickel (Ni), neodymium (Nd), and copper (Cu), or any alloy of the metals. Also, the gate electrode GE may be formed in a single layer. However, the present disclosure is not limited thereto, and the gate electrode GE may be formed in a multi-layer in which two or more materials among the metals and the alloys are stacked.

A second gate insulating layer GI2 may cover the gate electrode GE and the capacitor lower electrode LE. The second gate insulating layer GI2 may be an inorganic insulating layer made of an inorganic material. The inorganic material may include polysiloxane, silicon nitride, silicon oxide, silicon oxynitride, and the like.

A capacitor upper electrode UE may be located on the second gate insulating layer GI2. The capacitor upper electrode UE may be made of a metal. For example, the capacitor upper electrode UE may be made of at least one of metals such as gold (Au), silver (Ag), aluminum (Al) molybdenum (Mo), chromium (Cr), titanium (Ti), nickel (Ni) neodymium (Nd), and copper (Cu), or any alloy of the metals. Also, the capacitor upper electrode UE may be formed in a single layer. However, the present disclosure is not limited thereto, and the capacitor upper electrode UE may be formed in a multi-layer in which two or more materials among the metals and the alloys are stacked.

The capacitor lower electrode LE and the capacitor upper electrode UE may constitute the capacitor Cst with the second gate insulating layer GI2 interposed therebetween. In FIG. 5, a case where the capacitor Cst has a two-layer electrode structure of the capacitor lower electrode LE and the capacitor upper electrode UE is illustrated. However, in another embodiment, the capacitor Cst may be configured in a three-layer electrode structure, using the active layer, be configured in a three-layer electrode structure, using an electrode in the same layer as source and drain electrodes SE and DE, or be configured in an electrode structure having four or more layers.

An interlayer insulating layer ILD may cover the capacitor upper electrode UE. The interlayer insulating layer ILD may be an inorganic insulating layer made of an inorganic material. The inorganic material may include polysiloxane, silicon nitride, silicon oxide, silicon oxynitride, and the like.

In this embodiment, for convenience of description, the first gate insulating layer GI1 the second gate insulating layer GI2, and the interlayer insulating layer ILD may be collectively referred to as a first insulating layer group ING1. The first insulating layer group ING1 may cover a portion of the transistor. In some embodiments, the first insulating layer group ING1 may further include the buffer layer BF.

The source electrode SE and the drain electrode DE of the transistor may be located on the interlayer insulating layer ILD. The source electrode SE and the drain electrode DE may be in contact with the source region and the drain region of the active layer through contact holes formed in the interlayer insulating layer ILD, the second gate insulating layer GI2, and the first gate insulating layer GI1, respectively.

The source electrode SE and the drain electrode DE may be made of a metal. For example, the source electrode SE and the drain electrode DE may be made of at least one of metals such as gold (Au), silver (Ag), aluminum (Al), molybdenum (Mo), chromium (Cr) titanium (Ti), nickel (Ni), neodymium (Nd), and copper (Cu), or any alloy of the metals.

A passivation layer PSV may cover the source electrode SE and the drain electrode DE of the transistor. The passivation layer PSV may be an inorganic insulating layer made of an inorganic material. The inorganic material may include polysiloxane, silicon nitride, silicon oxide, silicon oxynitride, and the like.

A first via layer VIA1 may cover the passivation layer PSV or the transistor. The first via layer VIA1 may be an organic insulating layer made of an organic material. The organic material may include an organic insulating material such as a polyacryl-based compound, a polyimide-based compound, a fluorine-based compound such as Teflon, or a benzocyclobutene-based compound. The organic insulating layer may be deposited using a method such as evaporation.

A connecting pattern CNP may be connected to the source electrode SE or the drain electrode DE of the transistor through an opening of the first via layer VIA1. The connecting pattern CNP may be made of at least one of metals such as gold (Au), silver (Ag), aluminum (Al), molybdenum (Mo), chromium (Cr), titanium (Ti), nickel (Ni), neodymium (Nd), and copper (Cu), or any alloy of the metals.

A second via layer VIA2 may cover the first via layer VIA1 and the connecting pattern CNP. The second via layer VIA2 may be an organic insulating layer made of an organic material. The organic material may include an organic insulating material such as a polyacryl-based compound, a polyimide-based compound, a fluorine-based compound such as Teflon, or a benzocyclobutene-based compound.

A first electrode EL1 may be connected to the connecting pattern CNP through an opening of the second via layer VIA2. In some embodiments, the first electrode EL1 may be an anode or cathode of the light emitting element.

In some embodiments, the configuration of the second via layer VIA2 and the connecting pattern CNP may be omitted, and the first electrode EL1 may be connected directly to the source electrode SE or the drain electrode DE of the transistor through the opening of the first via layer VIA1. In some embodiments, the passivation layer PSV may be omitted.

The first electrode EL1 may be made of a metal layer including Ag, Mg, Al, Pt, Pd, Au, Ni, Nd, Ir, Cr, any alloy thereof, etc. and/or indium tin oxide (ITO), indium zinc oxide (IZO), zinc oxide (ZnO), indium tin zinc oxide (ITZO), etc. The first electrode EL1 may be made of a kind of metal. However, the present disclosure is not limited thereto, and the first electrode EL1 may be made of an alloy of two kinds of metals, e.g., Ag and Mg.

When an image is to be provided in the lower direction of the substrate SUB, the first electrode EL1 may be formed of a transparent conductive layer. When an image is to be provided in the upper direction of the substrate SUB, the first electrode EL1 may be formed of a metal reflective layer and/or a transparent conductive layer.

A pixel defining layer PDL defining a light emitting region of each pixel PXij is provided on the substrate SUB on which the first electrode EL1 and the like are formed. The pixel defining layer PDL may be an organic insulating layer made of an organic material. The organic material may include an organic insulating material such as a polyacryl-based compound, a polyimide-based compound, a fluorine-based compound such as Teflon, or a benzocyclobutene-based compound.

The pixel defining layer PDL may expose an upper surface of the first electrode EL1 and protrude from the substrate SUB along the circumference of the pixel PXij. An organic layer OL may be provided in the region of the pixel PXij, which is surrounded by the pixel defining layer PDL.

The organic layer OL may include a low-molecular or high-molecular material. In an embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum (Alq3), and the like. These materials may be formed using a method such as vacuum deposition. The high-molecular material may include poly(3,4-ethylenedioxythiophene (PEDOT)-, poly(phenylene-vinylene) (PPV)-, poly(fluorine)-based materials.

The organic layer OL may be provided in a single layer, but may be provided in a multi-layer including various functions. When the organic layer OL is provided as the multi-layer, the organic layer OL may have a structure in which a hole injection layer (HIL), a hole transport layer (HTL), an emission layer (EML), an electron transport layer (ETL), an electron injection layer (EIL), and the like are stacked in a single or complex structure. The organic layer may be formed using screen printing, inkjet printing, laser induced thermal imaging (LITI), etc.

In some embodiments, at least a portion of the organic layer OL may be integrally formed throughout a plurality of first electrodes EL1, or be individually provided to correspond to each of the plurality of first electrodes EL1.

A second electrode EL2 may be provided on the organic layer OL. The second electrode EL2 may be provided for each pixel PXij. However, the second electrode EL2 may be provided to cover a majority of the display area DA, and be shared by a plurality of pixels PXij.

In some embodiments, the second electrode EL2 may be used as a cathode or anode. When the first electrode EL1 is the anode, the second electrode EL2 may be used as the cathode. When the first electrode EL1 is the cathode, the second electrode EL2 may be used as the anode.

The second electrode EL2 may be made of a metal layer including Ag, Mg, Al, Pt, Pd, Au, Ni, Nd, Ir, Cr, etc., and/or a transparent conductive layer including indium tin oxide (ITO), indium zinc oxide (IZO), zinc oxide (ZnO), indium tin zinc oxide (ITZO), etc. In an embodiment of the present disclosure, the second electrode EL2 may be provided in a multi-layer having two or more layers including a metal thin film. For example, the second electrode EL2 may be provided in a triple layer of ITO/Ag/ITO.

When an image is to be provided in the lower direction of the substrate SUB, the second electrode EL2 may be formed of a metal reflective layer and/or a transparent conductive layer. When an image is to be provided in the upper direction of the substrate SUB, the second electrode EL2 may be formed of a transparent conductive layer.

A set of the first electrode EL1, the organic layer OL, and the second electrode EL2 may be referred to as the light emitting element.

An encapsulation layer TFE may be provided over the second electrode EL2. The encapsulation layer TFE may be provided in a single layer, but be provided in a multi-layer. In this embodiment, the encapsulation layer TFE may include first to third encapsulation layers ENC1, ENC2, and ENC3. The first to third encapsulation layers ENC1, ENC2, and ENC3 may be made of an organic material and/or an inorganic material. The third encapsulation layer ENC3 located at the outermost side of the encapsulation layer TFE may be made of an inorganic material. For example, the first encapsulation layer ENC1 may be made of an inorganic material, the second encapsulation layer ENC2 may be made of an organic material, and the third encapsulation layer ENC3 may be made of an inorganic material. As compared with the organic material, moisture or oxygen less penetrates into the inorganic material, but the inorganic material is weak to cracks due to its small elasticity or flexibility. The first encapsulation layer ENC1 and the third encapsulation layer ENC3 are formed of an inorganic material, and the second encapsulation layer ENC2 is formed of an organic material, so that the propagation of cracks can be prevented. The layer made of the organic material, i.e., the second encapsulation layer ENC2 may be completely covered by the third encapsulation layer ENC3 such that an end portion of the second encapsulation layer ENC2 is not exposed to the outside. The organic material may include an organic insulating material such as a polyacryl-based compound, a polyimide-based compound, a fluorine-based compound such as Teflon, or a benzocyclobutene-based compound. The inorganic material may include inorganic insulating materials such as polysiloxane, silicon nitride, silicon oxide, and silicon oxynitride.

The organic layer OL constituting the light emitting element may be easily damaged by moisture or oxygen from the outside. The encapsulation layer TFE protects the organic layer OL by covering the organic layer OL. The encapsulation layer TFE covers the display area DA, and may extend up to the non-display area NDA that is the outside of the display area DA. Insulating layers made of an organic material may be flexible, elastic, etc., but moisture or oxygen easily penetrates into the insulating layers, as compared with insulating layers made of an inorganic material. In an embodiment of the present disclosure, in order to prevent the moisture or oxygen from penetrating into the insulating layers made of the organic material, end portions of the insulating layers made of the organic material may be covered by the insulating layers made of the inorganic material not to be exposed to the outside. For example, the first via layer VIA1, the second via layer VIA2, and the pixel defining layer PDL, which are made of an organic material, do not continuously extend up to the non-display area NDA, and may be covered by the first encapsulation layer ENC1. Accordingly, an upper surface of the pixel defining layer PDL and side surfaces of the first via layer VIA1, the second via layer VIA2, and the pixel defining layer PDL are encapsulated by the encapsulation layer TFE including an inorganic material, so that their exposure to the outside can be prevented.

However, whether the encapsulation layer TFE is provided in a multi-layer or the material of the encapsulation layer TFE is not limited thereto, and be variously modified. For example, the encapsulation layer TFE may include a plurality of organic material layers and a plurality of inorganic material layers, which are alternately stacked.

A sensing electrode SC may be located on the encapsulation layer TFE. In some embodiments, an additional buffer layer may be located between the sensing electrode SC and the encapsulation layer TFE. The sensing electrode SC may be made of a metal layer including Ag, Mg, Al, Pt, Pd, Au, Ni Nd, Ir, Cr, etc. and/or a transparent conductive layer including indium tin oxide (ITO), indium zinc oxide (IZO), zinc oxide (ZnO), indium tin zinc oxide (ITZO), etc. In some embodiments, one sensing electrode SC may cover a plurality of pixels PXij. When the sensing electrode SC is configured with an opaque conductive layer, the sensing electrode SC may include a plurality of openings exposing the plurality of covered pixels PXij. For example, the sensing electrode SC may be configured in a mesh shape. When the sensing electrode SC is configured with a transparent conductive layer, the sensing electrode SC may be configured in a plate shape including no opening.

Next, the non-display area NDA and the additional area ADA will be described. Hereinafter, when the non-display area NDA and the additional area ADA are described, portions that have already been described will be omitted or be briefly described to avoid redundancy.

A dam DAM may be located between the planarization layer FLT and the second encapsulation layer ENC2. The dam DAM may be a multi-layered structure, and include, for example, a first dam DAM1 and a second dam DAM2. For example, the first and second dams DAM1 and DAM2 may be made of an organic material. Each of the first and second dams DAM1 and DAM2 may correspond to any one of the first via layer VIA1, the second via layer VIA2, and the pixel defining layer PDL. In an example, when the first dam DAM1 is made of the same material through the same process as the first via layer VIA1, the second dam DAM2 may be made of the same material through the same process as the second via layer VIA2 or the pixel defining layer PDL, In another example, when the first dam DAM1 is made of the same material through the same process as the second via layer VIA2, the second dam DAM2 may be made of the same material through the same process as the pixel defining layer PDL.

The dam DAM may prevent the organic material of the second encapsulation layer ENC2, which has strong liquidity, from overflowing to the outside of the dam DAM in a process of forming the second encapsulation layer ENC2, The first and third encapsulation layers ENC1 and ENC3 made of the inorganic material may be extended to cover the dam DAM, so that the adhesion with the substrate SUB or other layers on the substrate SUB can be reinforced.

A pad electrode PDE is located on the substrate SUB, and may be spaced apart from the planarization layer FLT. The pad electrode PDE may be supported by a second insulating layer group ING2. Insulating layers of the second insulating layer group ING2 may correspond to those of the first insulating layer group ING1, respectively. The pad electrode PDE may include a first pad electrode PDE1 and a second pad electrode PDE2. The first pad electrode PDE1 may be made of the same material as the source electrode SE and the drain electrode DE. The second pad electrode PDE2 may be made of the same material as the connecting pattern CNP.

The planarization layer FLT is located on the substrate SUB, and may be spaced apart from a region covered by the encapsulation layer TFE. The planarization layer FLT may be an organic insulating layer made of an organic material. The organic material may include an organic insulating material such as a polyacryl-based compound, a polyimide-based compound, a fluorine-based compound such as Teflon, or a benzocyclobutene-based compound.

In this embodiment, the planarization layer FLT may be formed after the interlayer insulating layer ILD is formed and before the source electrode SE and the drain electrode DE are formed. Therefore, the planarization layer FLT and the first via layer VIA1 may be formed through different processes. In some embodiments, the planarization layer FLT and the first via layer VIA1 may include different organic materials.

One end of the planarization layer FLT may cover the first insulating layer group ING1. In addition, a portion of the planarization layer FLT, which corresponds to the bent area BA, may fill a first trench TCH1 between the first insulating layer group ING1 and the second insulating layer group ING2. An upper surface of the one end of the planarization layer FLT may be higher than an upper surface of the portion of the planarization layer FLT from the substrate SUB.

Since the inorganic insulating layers have high hardness and small flexibility as compared with the organic insulating layer, the probability that cracks will occur is relatively high. When cracks occur in the inorganic insulating layers, the cracks may propagate to lines on the inorganic insulating layer, and as a result, a failure such as line disconnection may occur.

Thus, as shown in FIG. 5, the inorganic insulating layers are removed in the bent area BA to form the first trench TCH1, and the first insulating layer group ING1 and the second insulating layer group ING2 may be separated from each other by the first trench TCH1. In this embodiment, a case where all inorganic insulating layers corresponding to the region of the first trench TCH1 are all removed is illustrated. In another embodiment, some inorganic insulating layers may remain. The remaining inorganic insulating layers include a slit to disperse bending stress generated from the bent area BA.

The first sensing line SL1 may be extended on the planarization layer FLT, and be electrically connected to the pad electrode PDE. The first sensing line SL1 may include a first portion SL1-1 and a second portion SL1-2. The first portion SL1-1 and the second portion SL1-2 may have substantially the same thickness. The first portion SL1-1 may be positioned higher than the second portion SL-2 from the substrate SL. In this embodiment, the first sensing line SL1 may be formed of the same material through the same process as the source electrode SE or the drain electrode DE of the transistor.

The passivation layer PSV may cover a portion of the first sensing line SL1. Also, the passivation layer PSV may include a first opening OPN1 that exposes the first sensing line SL1.

A first line protective layer LPL1 may cover the planarization layer FLT and the first sensing line SL1. In addition, a second line protective layer LPL2 may cover the first line protective layer LPL1. In some embodiments, the configuration of the second line protective layer LPL2 may be omitted. The first and second line protective layers LPL1 and LPL2 may include openings corresponding to the first opening OPN1.

The first and second line protective layers LPL1 and LPL2 may be formed of an organic material. Each of the first and second line protective layers LPL1 and LPL2 may correspond to any one of the first via layer VIA1, the second via layer VIA2, and the pixel defining layer PDL. In an example, when the first line protective layer LPL1 is formed of the same material through the same process as the first via layer VIA1, the second line protective layer LPL2 may be formed of the same material through the same process as the second via layer VIA2 or the pixel defining layer PDL. In another example, when the first line protective layer LPL1 is formed of the same material through the same process as the second via layer VIA2, the second line protective layer LPL2 may be formed of the same material through the same process as the pixel defining layer PDL.

The second sensing line SL2 that is extended from the sensing electrode SC is connected to the first sensing line SL1 on the planarization layer FLT, For example, the second sensing line SL2 may be connected to the first sensing line SL1 through the first opening OPN1. When the first sensing line SL1 and the second sensing line SL2 is connected to each other in the first opening OPN1, no intervening layer is present between the first sensing line SL1 and the second sensing line SL2 and thus the first sensing line SL1 and the second sensing line SL2 are in contact with each other. For example, the second sensing line SL2 is in contact with the first portion SL1-1 of the first sensing line SL1 through the first opening OPN1, The second sensing line SL2 may be formed of the same material through the same process as the sensing electrode SC.

According to this embodiment, a first portion of the first sensing line SL1, which is located on the first insulating group ING1 and the one end of the planarization layer FLT, may be positioned higher from the substrate SUB than a second portion of the first sensing line SL1, which is located on a portion of the planarization layer FLT defined by the first trench TCH1.

Thus, the first sensing line SL1 and the second sensing line SL2 may be connected directly to each other without any bridge line. For example, the second sensing line SL2 may be in contact with the first portion SL-1 of the first sensing line SL-1. Since there is no bridge line, the connection reliability between the first sensing line SL1 and the second sensing line SL2 is improved.

The third sensing line SL3 may connect the pad electrode PDE and the first sensing line SL1. The third sensing line SL3 may be formed of the same material through the same process as the gate electrode GE of the transistor. In some embodiments, the third sensing line SL3 may be formed of the same material through the same process as the capacitor upper electrode UE. In some embodiments, an odd-numbered third sensing line SL3 may be formed of the same material through the same process as the gate electrode GE of the transistor, and an even-numbered third sensing line SL3 may be formed of the same material through the same process as the capacitor upper electrode UE. Herein, third sensing line SL3 in plural may be arranged in a direction as shown in FIG. 4 and for the convenience of description, the third sensing line SL3 may be numbered in the order of arrangement thereof. In this case, the odd-numbered third sensing line SL3 and the even-number third sensing line SL3 are alternately arranged in the direction. On the contrary, the even-numbered third sensing line SL3 may be formed of the same material through the same process as the gate electrode GE of the transistor, and the odd-numbered third sensing line SL3 may be formed of the same material through the same process as the capacitor upper electrode UE. Accordingly, a short circuit between adjacent lines may be more efficiently prevented.

The second insulating layer group ING2 may include a second opening OPN2 that exposes the third sensing line SL3. In addition, the planarization layer FLT may include an opening corresponding to the second opening OPN2. The first sensing line SL1 may be connected to the third sensing line SL3 through the second opening OPN2.

Figure 6:
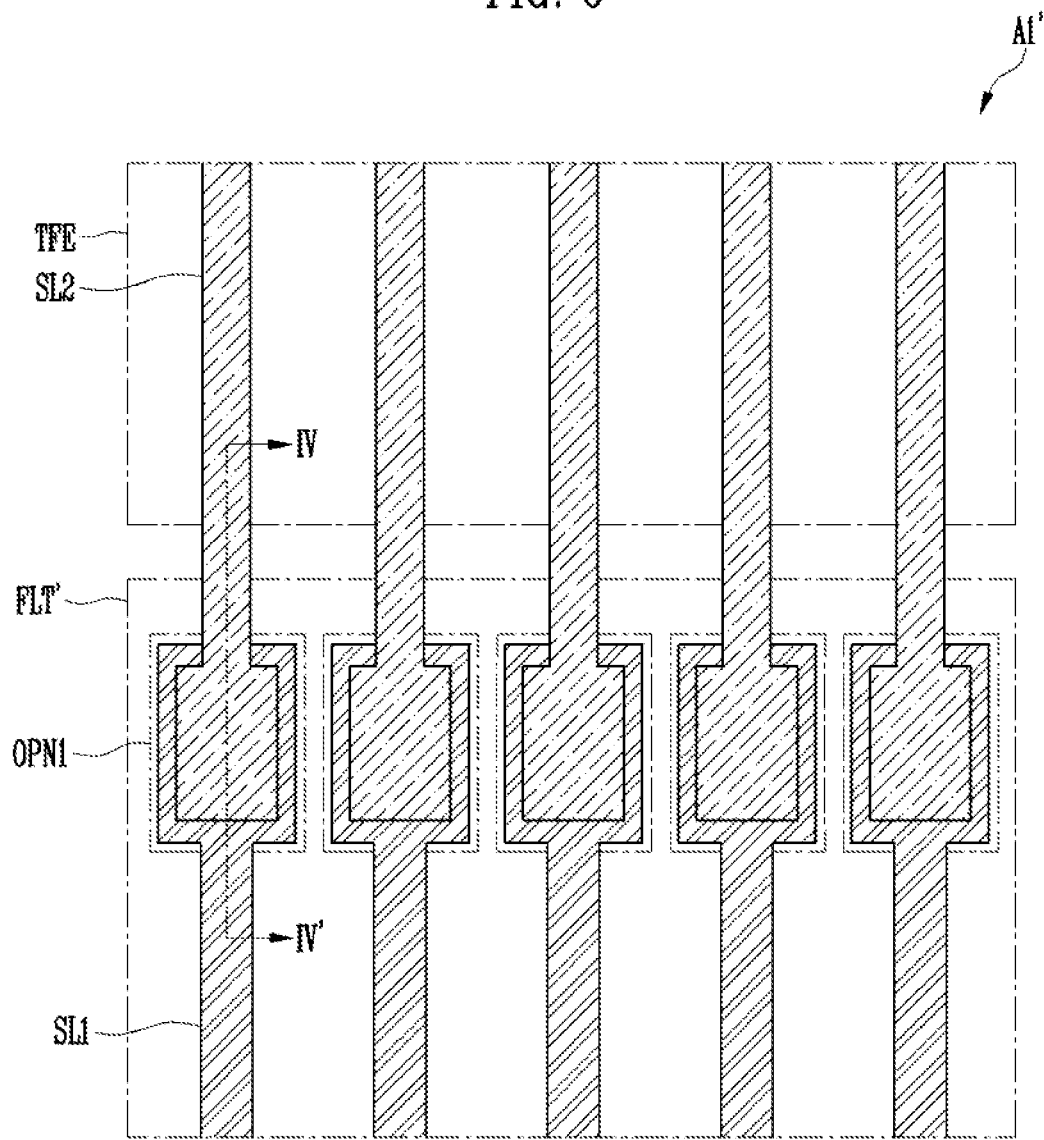
FIG. 6 is a view illustrating a first area according to a second embodiment of the present disclosure.
Figure 7:
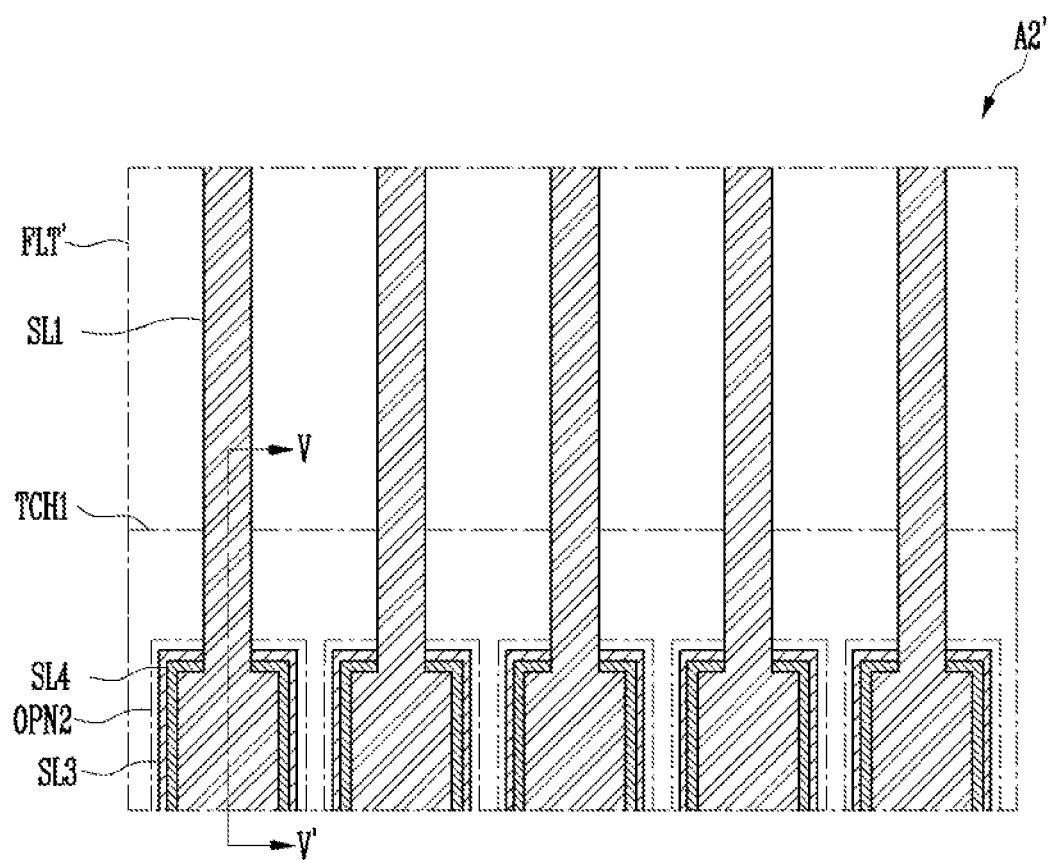
FIG. 7 is a view illustrating a second area according to the second embodiment of the present disclosure.
Figure 8:
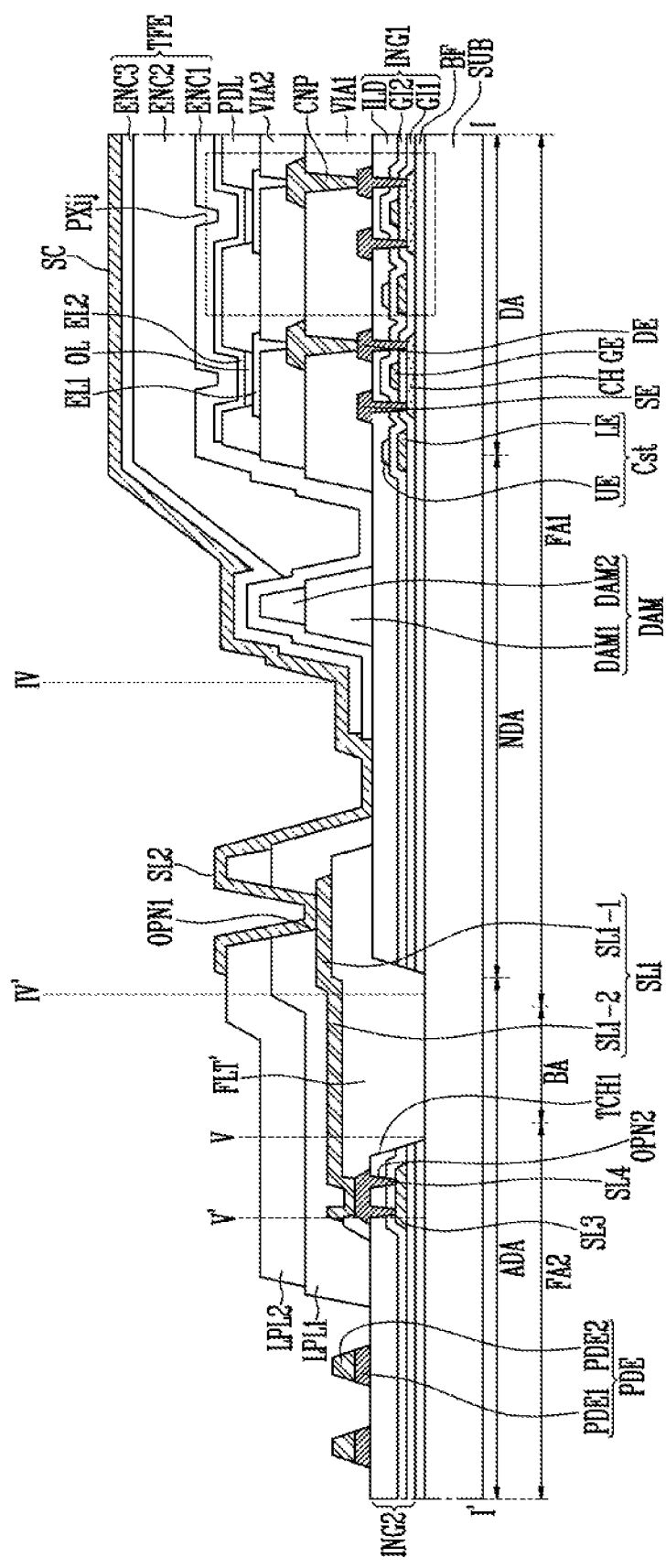
FIG. 8 is a sectional view taken along lines I-I', IV-IV', and V-V' according to the second embodiment of the present disclosure.

FIG. 6 is a view illustrating a first area according to an embodiment of the present disclosure. FIG. 7 is a view illustrating a second area according to the embodiment of the present disclosure. FIG. 8 is a sectional view taken along lines I-I', IV-IV', and V-V' according to the embodiment of the present disclosure.

In description of FIG. 8, contents overlapping with those of FIG. 5 will be omitted.

Unlike FIG. 5, in the embodiment of FIG. 8, a planarization layer FLT' may be formed of the same material through the same process as the first via layer VIA1. In addition, the passivation layer PSV may be omitted.

A first mask for forming the planarization layer FLT of FIG. 5 and a second mask for forming the passivation layer PSV may be omitted. Thus, process cost may be reduced.

In the embodiment of FIG. 8, the first sensing line SL1 may be formed of the same material through the same process as the connecting pattern CNP.

Unlike FIG. 5, in the embodiment of FIG. 8, a fourth sensing line SL4 for connecting the third sensing line SL3 and the first sensing line SL1 may be further included. The second opening OPN2 of the second insulating layer group ING2 may expose the third sensing line SL3, and be covered by the fourth sensing line SL4. The planarization layer FLT' may include an opening that exposes the fourth sensing line SL4, corresponding to the second opening OPN2. The fourth sensing line SL4 may be formed of the same material as the source electrode SE or the drain electrode DE of the transistor.

Figure 9:
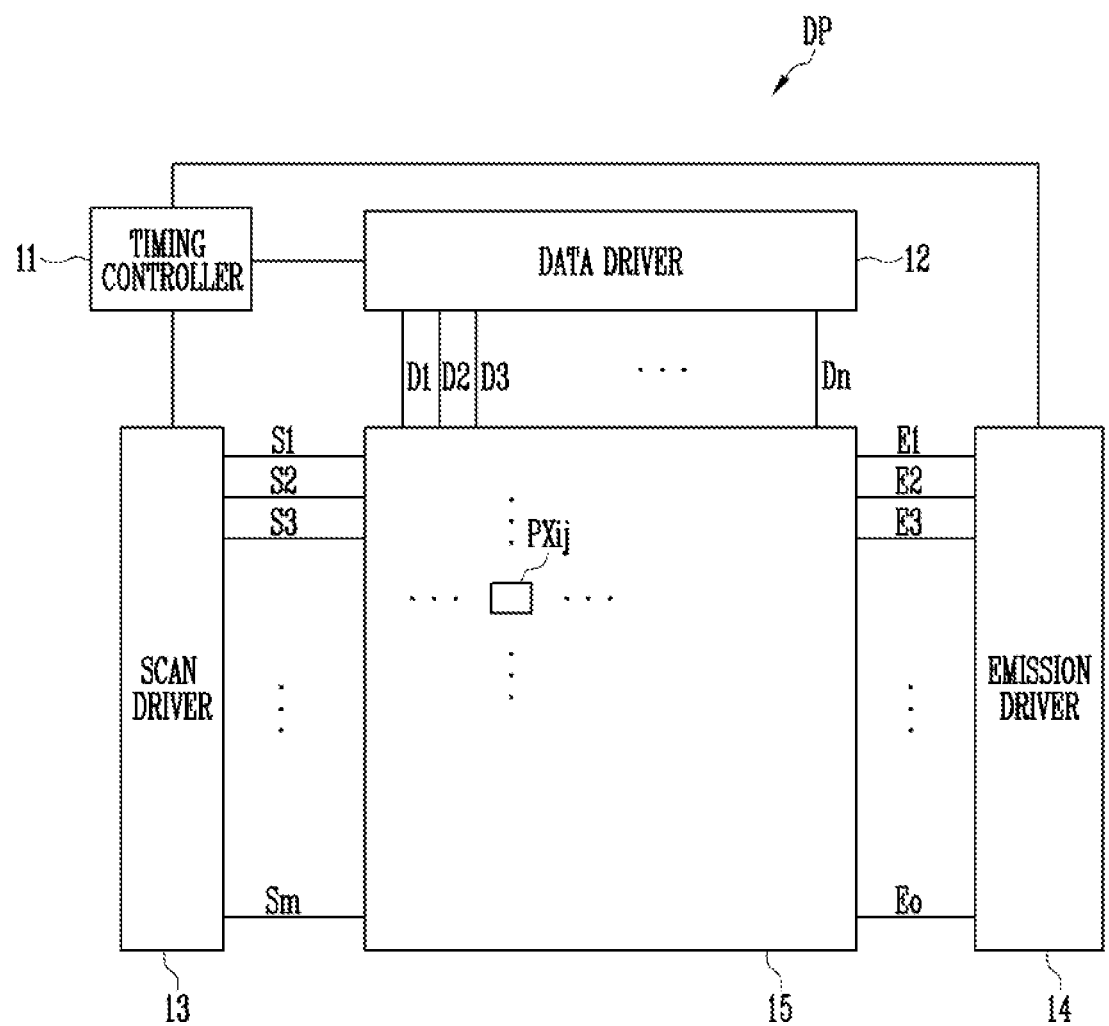
FIGS. 9 to 11 are views illustrating a pixel according to an embodiment of the present disclosure.
Figure 10:
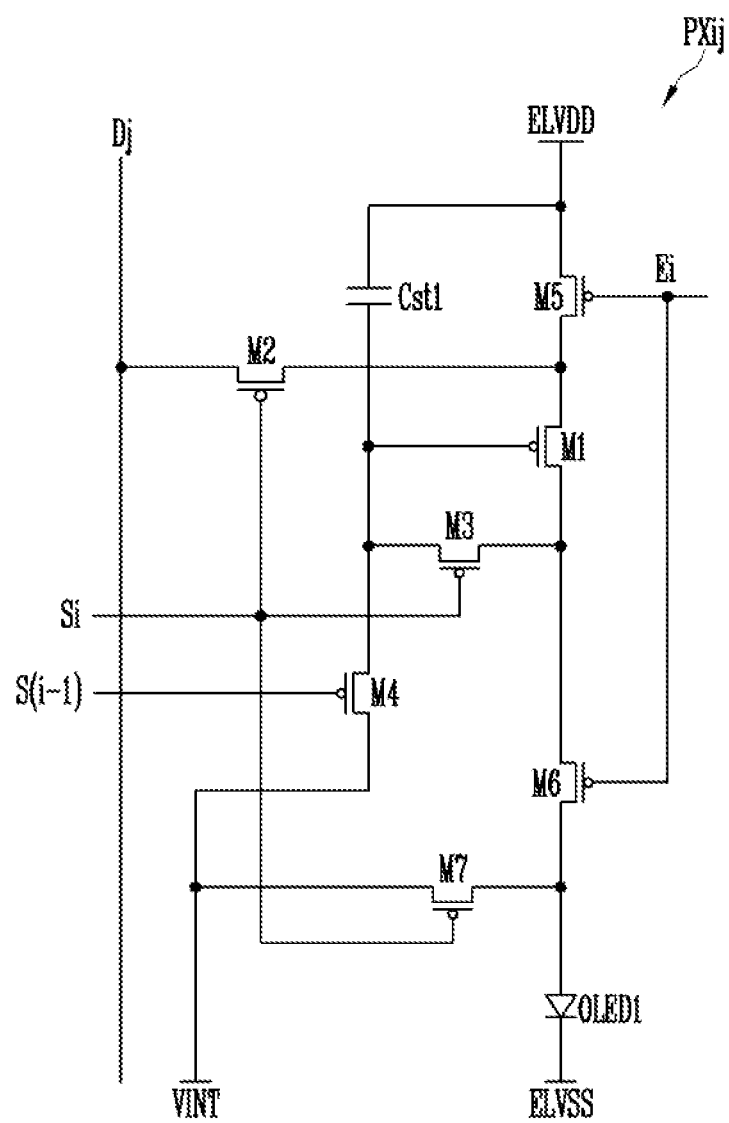
Figure 11:
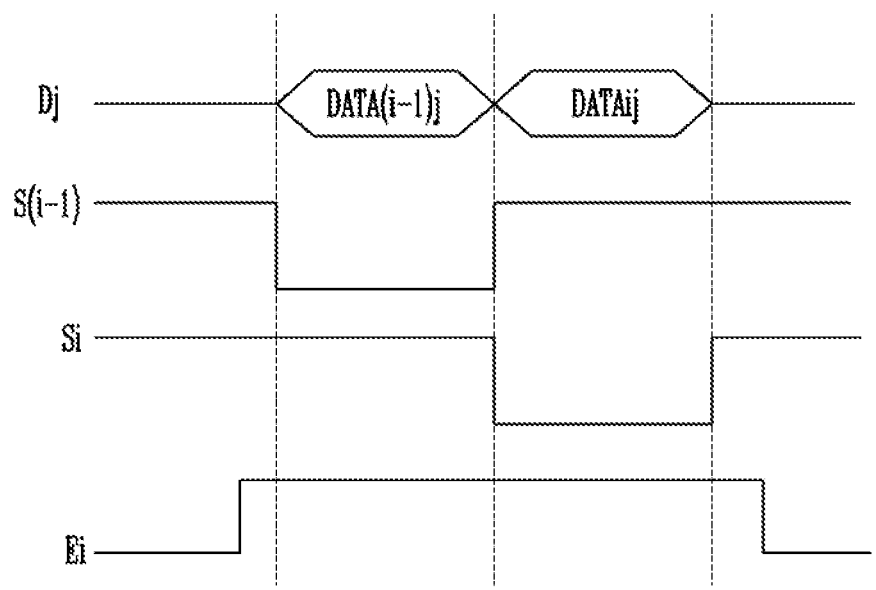

FIGS. 9 to 11 are views illustrating a pixel according to an embodiment of the present disclosure.

Referring to FIG. 9, a display device DP according to the embodiment of the present disclosure may include a timing controller 11, a data driver 12, a scan driver 13, an emission driver 14, and a pixel array 15.

The timing controller 11 may provide grayscale values and control signals to the data driver 12 to be suitable for specifications of the data driver 12. Also, the timing controller 11 may provide a clock signal, a scan start signal, etc. to the scan driver 13 to be suitable for specifications of the scan driver 13, Also, the timing controller 11 may provide a clock signal, an emission stop signal, etc. to the emission driver 14 to be suitable for specifications of the emission driver 14.

The data driver 12 may generate data voltages to be provided to data lines D1, D2, D3, . . . , and Dn, using the grayscale values and control signals, which are received from the timing controller 11. For example, the data driver 12 may sample grayscale values, using a clock signal, and apply data voltages corresponding to the grayscale values to the data lines D1 to Dn in units of pixel rows, Here, n may be a natural number.

The scan driver 13 may generate scan signals to be provided to scan lines S1, S2, S3, . . . , and Sm by receiving the clock signal, the scan start signal, etc. from the timing controller 11. For example, the scan driver 13 may sequentially provide the scan signals having a turn-on level pulse to the scan line S1 to Sm. For example, the scan driver 13 may be configured in the form of a shift register, and generate the scan signals in a manner that sequentially transfers the scan start signal provided in the form of a turn-on level pulse to a next stage circuit under the control of the clock signal.

The emission driver 14 may generate emission signals to be provided to emission lines E1, E2, E3, . . . , and Eo by receiving the clock signal, the emission stop signal, etc. from the timing controller 11. For example, the emission driver 14 may sequentially provide the emission signals having a turn-off level pulse to the emission lines E1 to Eo. For example, the emission driver 14 may be configured in the form of a shift register, and generate the emission signals in a manner that sequentially transfers the emission stop signal provided in the form of a turn-off level pulse to a next stage circuit under the control of the clock signal. Here, o may be a natural number.

The pixel array 15 includes a plurality of pixels. Each pixel PXij may be connected to a corresponding data line, a corresponding scan line, and a corresponding emission line. Here, i and j may be natural numbers. The pixel PXij may mean a pixel in which a scan transistor is connected to an ith scan line and is connected to a jth data line.

Referring to FIG. 10, the pixel PXij may include transistors M1 M2, M3, M4, M5, M6, and M7, a storage capacitor Cst1, and an organic light emitting diode OLED1.

In this embodiment, the transistors are implemented with a P-type transistor. The present inventive concept is not limited thereto. For example, a pixel circuit having the same function may be implemented using an N-type transistor.

One electrode of the storage capacitor Cst1 is connected to a first power voltage line ELVDD, and the other electrode of the storage capacitor Cst1 is connected to a gate electrode of the transistor M1.

One electrode of the transistor M1 is connected to the other electrode of the transistor M5, the other electrode of the transistor M1 is connected to one electrode of the transistor M6, and the gate electrode of the transistor M1 is connected to the other electrode of the storage capacitor Cst1, The transistor M1 may be referred to as a driving transistor. The transistor M1 determines an amount of driving current flowing between the first power voltage line ELVDD and a second power voltage line ELVSS according to a potential difference between the gate electrode and a source electrode.

One electrode of the transistor M2 is connected to a data line Dj, the other electrode of the transistor M2 is connected to the one electrode of the transistor M1, and a gate electrode of the transistor M2 is connected to a current scan line S1. The transistor M2 may be referred to as a switching transistor, a scan transistor or the like. The transistor M2 allows a data voltage of the data line Dj to be input to the pixel PXij when a turn-on level scan signal is applied to the current scan line Si.

One electrode of the transistor M3 is connected to the other electrode of the transistor M1, the other electrode of the transistor M3 is connected to the gate electrode of the transistor M1, and a gate electrode of the transistor M3 is connected to the current scan line Si. The transistor M3 allows the transistor M1 to be diode-connected when a turn-on level scan signal is applied to the current scan line Si.

One electrode of the transistor M4 is connected to the gate electrode of the transistor M1, the other electrode of the transistor M4 is connected to an initialization voltage line VINT, and a gate electrode of the transistor M4 is connected to a previous scan line S(i−1). In another embodiment, the gate electrode of the transistor M4 may be connected to another scan line. The transistor M4 transfers an initialization voltage to the gate electrode of the transistor M1 when a turn-on level scan signal is applied to the previous scan line S(i−1), to initialize a charge quantity of the gate electrode of the transistor M1.

One electrode of the transistor M5 is connected to the first power voltage line ELVDD, the other electrode of the transistor M5 is connected to the one electrode of the transistor M1, and a gate electrode of the transistor M5 is connected to an emission line Ei. The one electrode of the transistor M6 is connected to the other electrode of the transistor M1 the other electrode of the transistor M6 is connected to an anode electrode of the organic light emitting diode OLED1 and a gate electrode of the transistor M6 is connected to the emission line Ei. Each of the transistors M5 and M6 may be referred to as an emission transistor. Each of the transistors M5 and M6 allows the organic light emitting diode OLED1 to emit light by forming a driving current path between the first power voltage line ELVDD and the second power voltage line ELVSS when a turn-on level emission signal is applied to the emission line Ei.

One electrode of the transistor M7 is connected to the anode electrode of the organic light emitting diode OLED1, the other electrode of the seventh transistor M7 is connected to the initialization voltage line VINT, and a gate electrode of the transistor M7 is connected to the current scan line Si. In another embodiment, the gate electrode of the transistor M7 may be connected to another scan line. For example, the gate electrode of the transistor M7 may be connected to the previous scan line S(i−1), a previous scan line before the previous scan line S(i−1), a next scan line ((i+1)th scan line), or a next scan line after the (i+1)th scan line. The transistor M7 transfer the initialization voltage to the anode electrode of the organic light emitting diode OLED1 when a turn-on level scan signal is applied to the current scan line Si, to initialize or discharge a charge quantity accumulated in the organic light emitting diode OLED1.

The anode electrode of the organic light emitting diode OLED1 is connected to the other electrode of the transistor M6, and a cathode electrode of the organic light emitting diode OLED1 is connected to the second power voltage line ELVSS.

First, a data voltage DATA(i−1)j of a previous pixel row is applied to the data line Dj, and a turn-on level (low level) scan signal is applied to the previous scan line S(i−1).

Since a turn-off level (high level) scan signal is applied to the current scan line Si, the transistor M2 is in a turn-off state, and the data voltage DATA(i−1)j of the previous pixel row is prevented from being input to the pixel PXij.

Since the transistor M4 is in a turn-on state, the initialization voltage is applied to the gate electrode of the transistor M1 such that the charge quantity of the gate electrode of the transistor M1 is initialized. Since a turn-off level emission signal is applied to the emission line Ei, the transistors M5 and M6 are in the turn-off state, and unnecessary emission of the organic light emitting diode OLED1 in the process of applying the initialization voltage is prevented.

Next, a data voltage DATAij of a current pixel row is applied to the data line Dj, and a turn-on level scan signal is applied to the current scan line Si. Accordingly, the transistors M2, M1, and M3 are in a conduction state, and the data line Dj and the gate electrode of the transistor M1 are electrically connected. Thus, the data voltage DATAij is applied to the other electrode of the storage capacitor Cst1, and the storage capacitor Cst1 accumulates a charge quantity corresponding to the difference between the voltage of the first power voltage line ELVDD and the data voltage DATAij.

Since the transistor M7 is in the turn-on state, the anode electrode of the organic light emitting diode OLED1 and the initialization voltage line VINT are electrically connected to each other, and the organic light emitting diode OLED1 is precharged or initialized to a charge quantity corresponding to the difference between the initialization voltage and the voltage of the second power voltage line ELVSS.

Subsequently, when a turn-on level emission signal is applied to the emission line Ei, the transistors M5 and M6 are in the conduction state, and the amount of driving current flowing through the transistor M1 is adjusted depending on a charge quantity accumulated in the storage capacitor Cst1, so that the driving current flows through the organic light emitting diode OLED1. The organic light emitting diode OLED1 emits light until before a turn-off level emission signal is applied to the emission line Ei.

Figure 12:
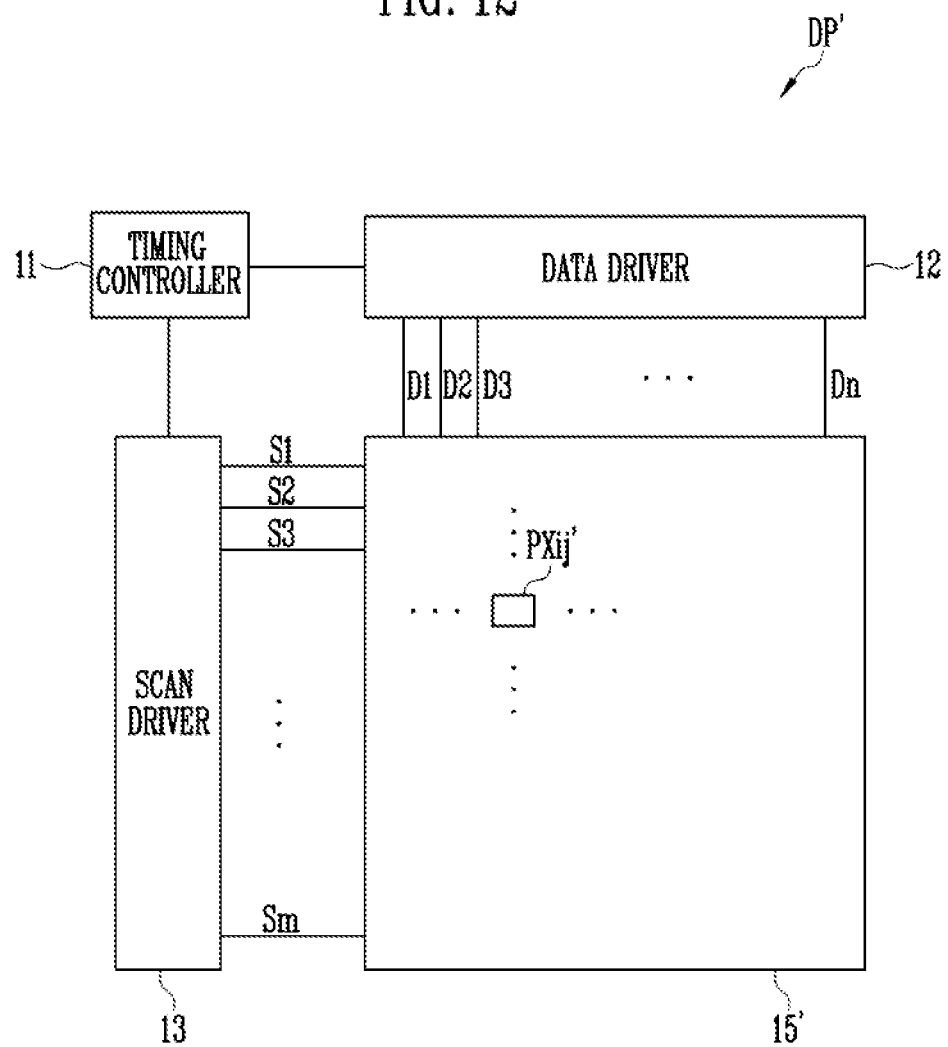
FIGS. 12 to 14 are views illustrating a pixel according to another embodiment of the present disclosure.
Figure 13:
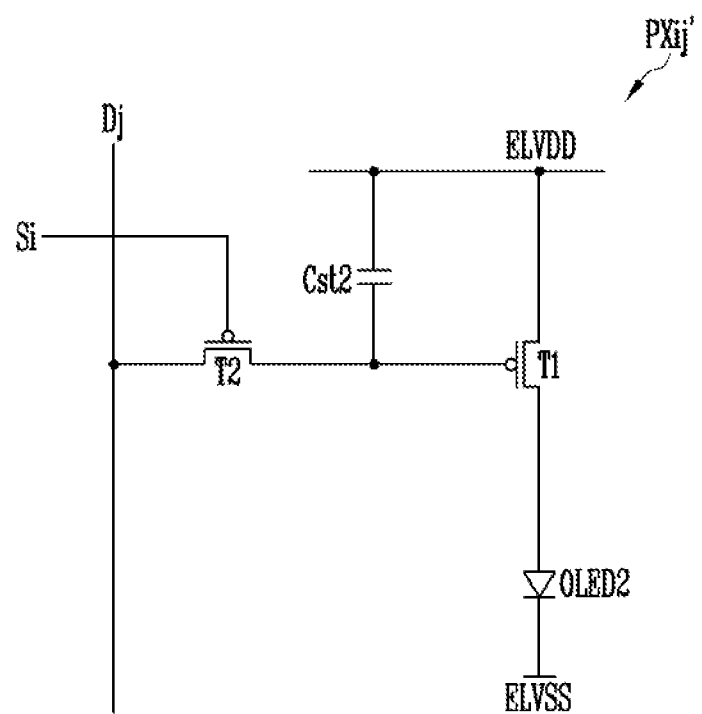
Figure 14:
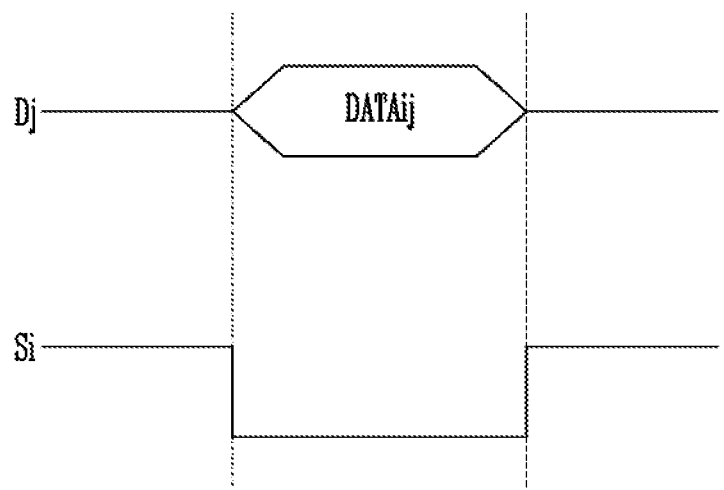

FIGS. 12 to 14 are views illustrating a pixel according to an embodiment of the present disclosure.

Referring to FIG. 12, a display device DP' according to an embodiment of the present disclosure may include a timing controller 11, data driver 12, a scan driver 13, and a pixel array 15'.

The display device DP' of FIG. 12 includes components substantially identical to those of the display device DP of FIG. 9, and therefore, overlapping descriptions will be omitted.

Referring to FIG. 13, the pixel PXij' may include a plurality of transistors T1 and T2, a storage capacitor Cst, and an organic light emitting diode OLED2.

A gate electrode of the transistor T2 is connected to a scan line Si, one electrode of the transistor T2 is connected to a data line Dj, and the other electrode of the transistor T2 is connected to a gate electrode of the transistor M1. The transistor T2 may be referred to as a switching transistor, a scan transistor or the like.

The gate electrode of the transistor M1 is connected to the other electrode of the transistor T2, one electrode of the transistor M1 is connected to a first power voltage line ELVDD, and the other electrode of the transistor M1 is connected to an anode electrode of the organic light emitting diode OLED2. The transistor T1 may be referred to as a driving transistor.

The storage capacitor Cst2 includes one electrode connected to the gate electrode of the transistor T1.

The anode electrode of the organic light emitting diode OLED2 is connected to the other electrode of the transistor M1, and a cathode electrode of the organic light emitting diode OLED2 is connected to a second power voltage line ELVSS.

When a turn-on level (low level) scan signal is supplied to the gate electrode of the transistor T2 through the scan line Si, the transistor T2 connects the data line Dj and one electrode of the storage capacitor Cst2. Therefore, a voltage value corresponding to the difference between a data voltage DATAij applied to the data line Dj and a voltage of the first power voltage line ELVDD is written or stored in the storage capacitor Cst2. The transistor T1 allows a driving current determined according to the voltage value written or stored in the storage capacitor Cst2 to flow from the first power voltage line ELVDD to the second power voltage line ELVSS. The organic light emitting diode OLED emits light with a luminance corresponding to an amount of driving current.

In the display device according to the present disclosure, the lines may be reliably connected while minimizing the non-display area between the bent area and the display area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a substrate;
a light emitting element located on the substrate;
an encapsulation layer covering the light emitting element;
a sensing electrode located on the encapsulation layer;
a first sensing line including a first portion and a second portion,
wherein the first portion is positioned higher than the second portion from the substrate;
a second sensing line extended from the sensing electrode, the second sensing line including a third portion being in contact with the first portion of the first sensing line; and
a planarization layer located on the substrate, the planarization layer, in top down view, being spaced apart from a region of the substrate covered by the encapsulation layer,
wherein the first portion of the first sensing line, the second portion of the first sensing line, and the third portion of the second sensing line are disposed on the planarization layer.

2. The display device of claim 1, further comprising:
a pad electrode located on the substrate, the pad electrode being spaced apart from the planarization layer;
a transistor electrically connected to the light emitting element; and
a first insulating layer group covering a portion of the transistor,
wherein the second portion of the first sensing line is extended on the planarization layer,
wherein the second portion of the first sensing line is electrically connected to the pad electrode,
wherein one end of the planarization layer covers the first insulating layer group, and
wherein the first portion of the first sensing line and the second sensing line are in contact with each other on the one end of the planarization layer.

3. The display device of claim 2, further comprising:
a second insulating layer group supporting the pad electrode; and
a first trench between the first insulating layer group and the second insulating layer group,
wherein a portion of the planarization layer fills the first trench, wherein an upper surface of the one end of the planarization layer is higher than an upper surface of the portion of the planarization layer from the substrate.

4. The display device of claim 3,
wherein the one end of the planarization layer is interposed between the first portion of the first sensing line and the first insulating layer group, and
wherein the second portion of the first sensing line is disposed on the portion of the planarization layer filling the first trench.

5. The display device of claim 4,
wherein the first insulating layer group includes a first gate insulating layer and an interlayer insulating layer,
wherein the first gate insulating layer covers a channel of the transistor, and
the interlayer insulating layer covers a gate electrode of the transistor.

6. The display device of claim 5, further comprising:
a passivation layer covering a source electrode and a drain electrode of the transistor,
wherein the passivation layer partially covers the first sensing line.

7. The display device of claim 6,
wherein the passivation layer includes a first opening that exposes the first portion of the first sensing line, and
wherein the second sensing line is in contact with the first portion of the first sensing line through the first opening.

8. The display device of claim 7, further comprising:
a first via layer covering the passivation layer and the transistor; and
a first line protective layer covering the planarization layer and the first sensing line.

9. The display device of claim 8,
wherein one end of the encapsulation layer is located between the first via layer and the first line protective layer.

10. The display device of claim 9,
wherein the first line protective layer includes an opening connected to the first opening.

11. The display device of claim 10, further comprising:
a third sensing line,
wherein the second insulating layer group includes a second opening that exposes the third sensing line, and
wherein the first sensing line is in contact with the third sensing line through the second opening.

12. The display device of claim 11,
wherein the planarization layer includes an opening connected to the second opening.

13. The display device of claim 12,
wherein the first sensing line is formed of the same material as the source electrode or the drain electrode of the transistor.

14. The display device of claim 13,
wherein the third sensing line is formed of the same material as the gate electrode of the transistor.

15. The display device of claim 6, further comprising:
a third sensing line; and
a fourth sensing line connecting the third sensing line and the first sensing line,
wherein the second insulating layer group further includes a second opening that exposes the third sensing line and is covered by the fourth sensing line.

16. The display device of claim 15,
wherein the planarization layer includes an opening that exposes the fourth sensing line and is connected to the second opening.

17. The display device of claim 16, further comprising:
a first via layer covering the transistor;
a connecting pattern connected to the source electrode or the drain electrode of the transistor through an opening of the first via layer;
a second via layer covering the first via layer and the connecting pattern; and
a first electrode of the light emitting element, wherein the first electrode of the light emitting element is connected to the connecting pattern through an opening of the second via layer.

18. The display device of claim 17,
wherein the first sensing line is formed of the same material as the connecting pattern.

19. The display device of claim 18,
wherein the third sensing line is formed of the same material as the gate electrode of the transistor.

20. The display device of claim 19,
wherein the fourth sensing line is formed of the same material as the source electrode or the drain electrode of the transistor.

21. The display device of claim 1,
wherein the first portion has a first thickness,
wherein the second portion has a second thickness, and
wherein the first thickness and the second thickness are substantially the same.

\* \* \* \* \*